(12) United States Patent
Plester et al.

(10) Patent No.: US 6,599,584 B2
(45) Date of Patent: Jul. 29, 2003

(54) BARRIER COATED PLASTIC CONTAINERS AND COATING METHODS THEREFOR

(75) Inventors: George Plester, Waterloo (BE); Horst Ehrich, Dorsten (DE)

(73) Assignee: The Coca-Cola Company, Atlanta, GA (US)

( * ) Notice: Subject to any disclaimer, the term of this patent is extended or adjusted under 35 U.S.C. 154(b) by 208 days.

(21) Appl. No.: 09/843,983

(22) Filed: Apr. 27, 2001

(65) Prior Publication Data

US 2002/0172763 A1 Nov. 21, 2002

(51) Int. Cl.$^7$ .............................................. C23C 14/08
(52) U.S. Cl. .................. 427/488; 427/491; 427/577; 427/579; 427/596; 427/249.15; 427/249.17; 427/255.31; 427/255.5; 427/255.6
(58) Field of Search ................. 427/488, 491, 427/577, 579, 596, 249.15, 249.17, 255.31, 255.6, 255.5

(56) References Cited

U.S. PATENT DOCUMENTS

| | | |
|---|---|---|
| 2,664,852 A | 1/1954 | Chadsey, Jr. |
| 2,665,226 A | 1/1954 | Godley, II et al. |
| 2,996,037 A | 8/1961 | Eng |
| 3,016,873 A | 1/1962 | Baer et al. |
| 3,511,703 A | 5/1970 | Peterson |
| 3,625,848 A | 12/1971 | Snapper |
| 4,230,068 A | 10/1980 | Itoh et al. |
| 4,438,368 A | 3/1984 | Abe et al. |
| 4,448,802 A | 5/1984 | Buhl et al. |
| 4,532,150 A | 7/1985 | Endo et al. |
| 4,532,196 A | 7/1985 | Yasui et al. |
| 4,552,791 A | 11/1985 | Hahn |
| 4,573,429 A | 3/1986 | Cobbs, Jr. et al. |
| 4,615,916 A | 10/1986 | Henderson |
| 4,634,605 A | 1/1987 | Wiesmann |
| 4,697,974 A | 10/1987 | Eltoukhy |
| 4,752,426 A | 6/1988 | Cho |

(List continued on next page.)

FOREIGN PATENT DOCUMENTS

| | | |
|---|---|---|
| DE | 1521421 | 12/1969 |
| DE | 3239131 A1 | 4/1984 |
| DE | 4026494 C2 | 5/1992 |
| DE | 42 03 371 C1 | 2/1993 |
| DE | 40 06 457 C2 | 9/1993 |
| DE | 4305721 C1 | 7/1994 |
| DE | 4343042 C1 | 3/1995 |
| DE | 4412906 C1 | 7/1995 |
| DE | 196 00 993 A1 | 8/1996 |
| DE | 44 44 763 C2 | 11/1996 |

(List continued on next page.)

Primary Examiner—Timothy Meeks
(74) Attorney, Agent, or Firm—Sutherland Asbill & Brennan LLP (57) ABSTRACT

Methods and systems are provided for making a coated plastic container, such as for packaged beverages, possessing a gas barrier and having enhanced resistance to loss in barrier due to handling abuses expansion of walls of the container. The system comprises a vacuum cell, a coating source in the vacuum cell for supplying a coating vapor to an external surface of a plastic container positioned within the vacuum cell, and gas feeds for supplying one or more process gases into an interior space of the vacuum cell. The coating source heats and evaporates an inorganic coating material, such as metal or silicon, to form a coating vapor, which is energized to form a plasma. The process gases include a carbon-containing gas, such as acetylene. The coating source is arranged within the vacuum cell such that the coating vapor and/or plasma reacts with at least one of the process gases and a thin coating is deposited and bonded on the external surface of the plastic container, such that the thin coating comprising carbon and inorganic material, such as an inorganic oxide.

43 Claims, 3 Drawing Sheets

U.S. PATENT DOCUMENTS

| | | | |
|---|---|---|---|
| 4,765,273 A | 8/1988 | Anderle | |
| 4,824,545 A | 4/1989 | Arnold et al. | |
| 4,849,088 A | 7/1989 | Veltrop et al. | |
| 4,888,199 A | 12/1989 | Felts et al. | |
| 4,902,531 A | 2/1990 | Nakayama et al. | |
| 4,917,786 A | 4/1990 | Ehrich | |
| 4,919,968 A | 4/1990 | Buhl et al. | |
| 4,956,196 A | 9/1990 | Wagner et al. | |
| 4,975,168 A | 12/1990 | Ohno et al. | |
| 5,084,356 A | 1/1992 | Deak et al. | |
| 5,085,904 A | 2/1992 | Deak et al. | |
| 5,091,210 A | 2/1992 | Mikoshiba et al. | |
| 5,096,558 A | 3/1992 | Ehrich | |
| 5,112,644 A | 5/1992 | Seddon et al. | |
| 5,215,640 A | 6/1993 | Buhl et al. | |
| 5,250,328 A | 10/1993 | Otto | |
| 5,308,649 A | 5/1994 | Babacz | |
| 5,308,950 A | 5/1994 | Ramm et al. | |
| 5,364,666 A | 11/1994 | Williams et al. | |
| 5,374,314 A | 12/1994 | Babacz | |
| 5,378,510 A | 1/1995 | Thomas et al. | |
| 5,387,326 A | 2/1995 | Buhl et al. | |
| 5,429,729 A | 7/1995 | Kamei et al. | |
| 5,437,895 A | 8/1995 | Kodama et al. | |
| 5,440,446 A | 8/1995 | Shaw et al. | |
| 5,462,779 A | 10/1995 | Misiano et al. | |
| 5,468,520 A | 11/1995 | Williams et al. | |
| 5,510,155 A | 4/1996 | Williams et al. | |
| 5,521,351 A | 5/1996 | Mahoney | |
| 5,531,060 A | 7/1996 | Fayet et al. | |
| 5,558,720 A | 9/1996 | Sarraf et al. | |
| 5,565,248 A | 10/1996 | Plester et al. | |
| 5,571,470 A | 11/1996 | Plester | |
| 5,616,369 A | 4/1997 | Williams et al. | |
| 5,641,559 A | 6/1997 | Namiki | |
| 5,651,867 A | 7/1997 | Kokaku et al. | |
| 5,662,741 A | 9/1997 | Ehrich | |
| 5,670,224 A | 9/1997 | Izu et al. | |
| 5,677,010 A | 10/1997 | Esser et al. | |
| 5,691,007 A | 11/1997 | Montgomery | |
| 5,704,983 A | 1/1998 | Thomas et al. | |
| 5,725,909 A * | 3/1998 | Shaw et al. | 427/412.1 |
| 5,948,224 A | 9/1999 | Signer | |
| 6,132,562 A | 10/2000 | Baumecker | |
| 6,223,683 B1 | 5/2001 | Plester et al. | |
| 6,224,948 B1 * | 5/2001 | Affinito | 427/488 |
| 6,276,296 B1 | 8/2001 | Plester | |
| 6,279,505 B1 | 8/2001 | Plester et al. | |
| 6,338,870 B1 * | 1/2002 | Jaccoud | 427/171 |
| 2001/0022272 A1 | 9/2001 | Plester et al. | |
| 2001/0042510 A1 | 11/2001 | Plester et al. | |
| 2002/0179603 A1 * | 12/2002 | Darras et al. | 220/62.11 |

FOREIGN PATENT DOCUMENTS

| | | |
|---|---|---|
| DE | 195 46 827 A1 | 6/1997 |
| EP | 0 460 796 A2 | 4/1991 |
| EP | 0 460 796 B1 | 4/1991 |
| EP | 0 535 810 A1 | 9/1992 |
| EP | 0 438 627 B1 | 5/1995 |
| EP | 0 785 291 A1 | 7/1997 |
| EP | 0 550 039 B1 | 3/1998 |
| GB | 2139647 * | 11/1984 |
| GB | 2 139 647 A | 11/1984 |
| GB | 2 263 472 A | 1/1992 |
| JP | 57169088 | 10/1982 |
| JP | 61104075 | 5/1986 |
| JP | 63243264 | 10/1988 |
| JP | 63312968 | 12/1988 |
| JP | 02118064 | 5/1990 |
| JP | 03036258 | 2/1991 |
| JP | 04048515 | 2/1992 |
| JP | 08092764 | 4/1996 |
| JP | 11290767 | 10/1999 |
| JP | 2001261075 | 9/2001 |
| WO | WO 92-12275 | 7/1992 |
| WO | WO 92/03841 | 2/1993 |

* cited by examiner

BARRIER COATED PLASTIC CONTAINERS AND COATING METHODS THEREFOR

TECHNICAL FIELD

This invention relates to plastic containers, such as beverage containers, that include a barrier coating to reduce gas permeation therethrough, wherein the barrier coating has enhanced resistance to loss of barrier properties caused by handling abuses and expansion of container walls.

BACKGROUND OF THE INVENTION

Plastic containers comprise a large and growing segment of the food and beverage industry. Plastic containers offer a number of advantages over traditional metal and glass containers. They are lightweight, inexpensive, nonbreakable, transparent, and easily manufactured and handled. However, plastic containers have at least one significant drawback that has limited their universal acceptance, especially in the more demanding food applications. That drawback is that all plastic containers are more or less permeable to water, oxygen, carbon dioxide, and other gases and vapors. In a number of applications, the permeation rates of affordable plastics are great enough to significantly limit the shelf-life of the contained food or beverage, or prevent the use of plastic containers altogether.

It is known that a container structure that combines the best features of plastic containers and more traditional containers could be obtained by applying a glass-like or metal-like layer to a plastic container, and metallized plastic containers. For example, metallized potato chip bags have been commercially available for some time. However, in applications where the clarity of the package is of significant importance, metallized coatings are not acceptable. Obtaining durable glass-like coatings on plastic containers without changing the appearance of the container has proven to be much more difficult.

A number of processes have been developed to apply glass-like coatings onto plastic films, where the films subsequently are formed into flexible plastic containers. However, relatively few processes have been developed that allow the application of a glass-like coating onto a preformed, relatively rigid plastic container such as the polyethylene terephthalate (PET) bottles commonly used in the U.S. for carbonated beverages, and heretofore no process has been developed to provide application of a glass-like coating onto the external surface of a plastic container that is sufficiently durable to withstand the effect of pressurization of the container, that retains an enhanced barrier to gases and vapors subsequent to said pressurization, and that does not affect the recyclability of the containers. Pressurized beverage containers currently comprise a very large market world-wide, and currently affordable plastics have sufficiently high permeation rates to limit the use of plastic containers in a number of the markets served.

Such pressurized containers include plastic bottles for both carbonated and non-carbonated beverages. Plastic bottles have been constructed from various polymers, predominantly PET, particularly for carbonated beverages. All of these polymers, however, exhibit various degrees of permeability to gases and vapors, which have limited the shelf life of the beverages contained within them. For example, carbonated beverage bottles have a shelf-life which is limited by loss of $CO_2$. (Shelf-life is typically defined as the time needed for a loss of seventeen percent of the initial carbonation of a beverage.) Because of the effect of surface to volume ratio, the rate of loss becomes greater as the size of the bottle is reduced. Small containers are needed for many market applications, and this severely limits the use of plastic bottles in such cases. Therefore, it is desirable to have a container with improved carbonation retention properties.

For non-carbonated beverages, similar limitations apply due to oxygen and/or water-vapor diffusion, again with increasing importance as the bottle size is reduced. Diffusion means both ingress and egress (diffusion and infusion) to and from the bottle or container. The degree of impermeability (described herein as "gas barrier") to $CO_2$ diffusion and to the diffusion of oxygen, water vapor, and other gases, grows in importance in conditions of high ambient temperature. An outer coating with high gas barrier can improve the quality of beverages packed in plastic bottles and increase the shelf life of such bottles, making small bottles a more feasible alternative, which presents many advantages in reduced distribution costs and a more flexible marketing mix.

It is also desirable that plastic containers such as PET bottles be recyclable. Known barrier enhanced coatings, however, are often organic and relatively thick and therefore can contaminate a recycled plastic product. Organic coating materials incorporated into recycled plastic make unsuitable containers for beverage or food items because the beverage or food items can contact the organic coating material and become contaminated. In addition, relatively thick coatings form relatively large particles during recycling of plastic material and can damage the appearance and properties of a resulting recycled plastic product. In particular, relatively large coating particles in recycled plastic can make otherwise clear plastic hazy. Hazy plastic is often undesirable for containers such as beverage and food containers.

Additionally, the cost of applying a coating to the outside of a bottle must not add significant cost to the basic package. This holds even when the coating is a gas barrier that significantly increases the shelf-life of beverage contained in that bottle, significantly reduces product spoilage of beverage contained in that bottle, significantly reduces product spoilage due to UV radiation, virtually eliminates environmental stress cracking, and/or provides a specific color. This criterion eliminates many processes for high gas barrier coatings, because plastic bottles are themselves a very low cost, mass produced article. Affordability implies in practice that the cost of the coating must add minimal or no increase to the cost of the whole package and in fact, the cost can be less.

A coating on the outside of plastic bottles must be capable of flexing. When bottles are used for pressurized containers, the coating preferably should be able to biaxially stretch whenever the plastic substrate stretches. It also is preferable that the coating be continuous over the majority of the container surface. Adhesion is particularly important in the case of carbonated beverages, since $CO_2$ within the bottle exerts some or all of its in-bottle pressure on the coating. This pressure can rise to exceed 6 bar, exerting considerable forces on the coating/plastic interface. The coating must also resist scuffing, normal handling, weathering (e.g., exposure to rain, sun, and temperature fluctuations), and the coating must maintain its gas barrier throughout the bottle's useful life.

There are several plasma-enhanced processes which apply an external, inorganic coating to a range of articles, which in some cases includes bottles. Many of the processes are targeted to provide coating properties which are quite different, and far less onerous than high gas barrier bottle coatings. Such processes target, for example, abrasion resistance, where the coating continuity is not a major factor, since the coating can protect the microscopic interstices. Other processes target cosmetic or light-reflection properties and some processes have a pure handling protection role. Often the substrate does not flex or stretch, and the article itself is higher priced than plastic bottles so that cost is not a benefit of the design. In some cases, the substrate allows far higher coating temperatures than those allowed by PET, the most common plastic-bottle material. Such processes generally do not provide the coating continuity, adhesion, and flexibility needed for high gas barrier coatings, nor do they provide a solution to the other problems associated with high gas barrier coatings described above.

PCT WO 98/40531, which addresses the foregoing deficiencies and problems, describes an electric arc process for the plasma-enhanced deposition of inorganic coatings onto a plastic substrate, under vacuum. A low voltage electric arc is generated between a cooled cathode and an anode, the anode being a crucible holding the coating solids, which are evaporated and plasma-energized by the energy of the arc. One or more reactive gases can be added to the plasma. A dense, well-adhering coating deposition is obtained due to a relatively large proportion of high-energy particles in the plasma. The method yields plastic containers having external glass-like barrier coatings.

Plastic containers in some applications, however, must withstand very high measures of handling abuse and/or conditions resulting in high expansion of the plastic substrate. High measures of handling abuse can occur in bottling plants, during distribution, and in the market. Examples of these abuses include (i) the use of empty bottle storage-silos and of bottle sorting/erection devices after these silos, which have the effect of continuously rubbing the bottles against each other and against metal contact parts, often severely scratching them; (ii) the use of bottle warmers that spray bottles with hot water, subjecting the surface to hot humid conditions and to the chemical effects of any water additives, such as de-scaling agents; (iii) the use of bottling lines designed to handle glass containers (not designed for the dedicated handling of PET containers), which lines generally are less gentle in handling plastic containers; and (iv) the distribution of containers over long distances in hot, dusty conditions, resulting in excessive damage due to container-to-container contact and abrasion. Conditions leading to high container expansion are usually the combination of high ambient temperature and humidity, particularly in the case of highly carbonated beverages (due to the high internal pressure of containers handling such beverages), and also particularly in the case of contour packages with decorative features (due to the weakening of the container wall by such features). Conditions of handling abuses and/or high container expansion, as given in the above examples, can lead to excessive coating damage, which will result in significant loss in barrier. These abuses and conditions can require coating design measures beyond those described in PCT WO 98/40531 in order to avoid a significant loss of barrier at the point-of-sale of some markets. A more robust coating would be advantageous in some applications.

It is therefore an object of the present invention to provide barrier coated plastic containers, and coating methods therefor, that reduce loss in barrier due to abrasion and other handling abuse and due to conditions leading to high expansion of plastic substrate.

It is another object of the present invention to provide an outer coating for a container, such as a heat sensitive plastic bottle, which has increased resistance to abrasion and other handling abuse and to conditions leading to high expansion of plastic substrate.

It is a further object of the present invention is to provide coatings for plastic containers having increased barrier as compared to that provided by the methods described in PCT WO 98/40531.

It is yet another object of the present invention to provide a coating and a system and method for coating which can provide an external glass-like coating that is flexible, durable and possess sufficient adhesion to withstand the effects of flexing, stretching, denting, and abrasion of the container, without significant loss of enhanced barrier properties.

SUMMARY OF THE INVENTION

Systems are provided for making a coated plastic container possessing a gas barrier and having enhanced resistance to loss in barrier due to handling abuses expansion of walls of the container. The system comprises (a) a vacuum cell capable of maintaining a vacuum within the vacuum cell; (b) at least one coating source disposed in the vacuum cell for supplying a coating vapor to an external surface of a plastic container positioned within the vacuum cell, wherein the coating source comprises an evaporator for heating and evaporating an inorganic coating material, such as metal or silicon, to form the coating vapor, and a means for energizing the coating vapor to form a plasma; and (c) gas feeds for supplying one or more process gases into an interior space of the vacuum cell, normally into the area of plasma-generation. At least one of the process gases is a carbon-containing gas, preferably a low-molecular weight organic gas, such as acetylene, ethylene, or ethane. The coating source is arranged within the vacuum cell such that the plasma reacts with at least one of the process gases and a thin coating is deposited and bonded on the external surface of the plastic container, such that the thin coating comprises carbon and inorganic material, the inorganic material being, for example, a clear/transparent inorganic oxide. The combination of coating components provides good gas barrier with enhanced resistance to loss in barrier.

Depending upon the selection of inorganic material and carbon-containing gas, a variety of barrier coatings can be produced, including colorless transparent oxide coatings; opaque or translucent coatings; and colored coatings.

The system can further include container feeders and conveyors for transporting multiple plastic containers into the vacuum cell and through coating process, preferably in a continuous or semi-continuous manner.

In another embodiment, the system comprises a vacuum cell and at least one main coating source as described above, along with (a) a gas feed for supplying one or more process gases into an interior space of the vacuum cell, and (b) at least one polymer coating source disposed in the same or another vacuum cell, for adding one or more coatings of polymer onto the plastic container positioned within the vacuum cell. The main coating source is arranged within the vacuum cell such that the plasma reacts with at least one of the process gases, which optionally includes a carbon-containing gas, and a thin coating is deposited and bonded on the external surface of the plastic container, such that the thin coating comprising inorganic material, such as an inorganic oxide. In a first variation of this system, the polymer coating source comprises a second gas feed comprising a polymerizable gas, and a means for energizing the polymerizable gas to form a plasma comprising polymerizable free radicals, such that the polymerizable free radicals deposit and polymerize to form a thin polymer coating on the plastic container. Examples of the polymerizable gas include olefins, paraffins, and mixtures thereof. Ethylene and acetylene are preferred. In a second variation of this system, the polymer coating source comprises a melter-evaporator for heating and evaporating a vaporizable polymer to form a polymer coating vapor, which recondenses and deposits to form a thin polymer coating on the plastic container. The vaporizable polymer is one that can be evaporable under vacuum conditions without decomposing, such as a polyolefin, a polyester, a polycarbonate, or a mixture thereof. Polyethylene is a preferred polymer. In either variation of the system, the thin polymer coating can be applied as a topcoat, an undercoat, or both, in relation to the main inorganic coating. The combination of inorganic coating, with or without optional carbon component, and polymer pre- and/or post-coat provides good gas barrier with enhanced resistance to loss in barrier.

In a preferred embodiment, the coated plastic container, when containing four volumes of carbon dioxide sealed in the interior volume, possesses a gas barrier of at least 1.25x the gas barrier of the plastic container without the coating, even after severe conditions of handling abuse and environments.

Methods for making coated plastic containers based on these systems are provided, along with the coated plastic containers themselves. Packaged beverages and packaging systems therefor also are provided.

DETAILED DESCRIPTION OF THE INVENTION

Methods and systems have been developed for coating containers, wherein the coatings provide good adhesion to a surface of the container, and good gas barrier, as well as the abrasion-resistance, stretchability and flexibility necessary to withstand severe handling abuses and expansion of walls of the container.

The coatings exhibit enhanced resistance to loss in barrier due to handling abuse and to the expansion of container walls, which is achieved by addition of a carbon-containing gas to the inorganic process gases, which are used for producing the main coating; and/or, use of polymerizable organic gas to deposit a thin polymer undercoat between the container surface and the main coating; and/or, use of polymerizable organic gas to deposit a thin polymer topcoat over the main coating; and/or, use of polymer, which evaporates without decomposition under the coating process vacuum conditions, to deposit a thin undercoat or a topcoat.

Throughout the present specification, a container or bottle will be described. An uncoated container may be referred to as a container body. While this container body will generally be described with reference to a plastic bottle, any suitable container can be treated by the method and system of the present invention. Accordingly, soft drink bottles of various sizes, other food containers or any other suitable container can be treated using the methods and systems described herein.

As used herein, the term "barrier" refers to the resistance to the permeation of gases and vapors, unless explicitly indicated otherwise.

I. Carbon-Containing Inorganic Coating Methods and Systems

A process has been developed to incorporate carbon into the inorganic barrier coatings described in PCT WO 98/40531. The carbon content in the inorganic coating activates the surface of the container by providing free radicals, thereby enabling better adhesion of the coating, which improves its barrier property. The carbon content in the inorganic coating also improves the barrier of the coating by (i) providing better coverage over the substrate's surface imperfections, because the gas flows into these imperfections better than the inorganic particles, thereby reducing or eliminating the incidence of pin-holes in the coating; (ii) providing greater coating flexibility, thus enabling the coating to flex and expand to same degree as the substrate without cracking, which reduces or eliminates the loss in barrier due to container expansion under severe conditions; (iii) provides additional cross-linking within the inorganic lattice to enhance the integrity of the coating; and (iv) reduces coating brittleness, thereby improving the coating's resistance to abrasion, handling abuse, and container expansion.

The carbon containing inorganic coatings have the advantage of enabling high barrier with higher resistance to barrier loss. In one embodiment, clear/transparent silicon dioxide coatings ("glass-like" coatings) can be produced with significantly improved barrier under severe handling and environmental conditions. For example, such coatings can exhibit increased barrier even after severe handling abuse in a bottling plant, or severe environmental conditions, leading to high bottle expansion.

The Coating System

Figure 1:
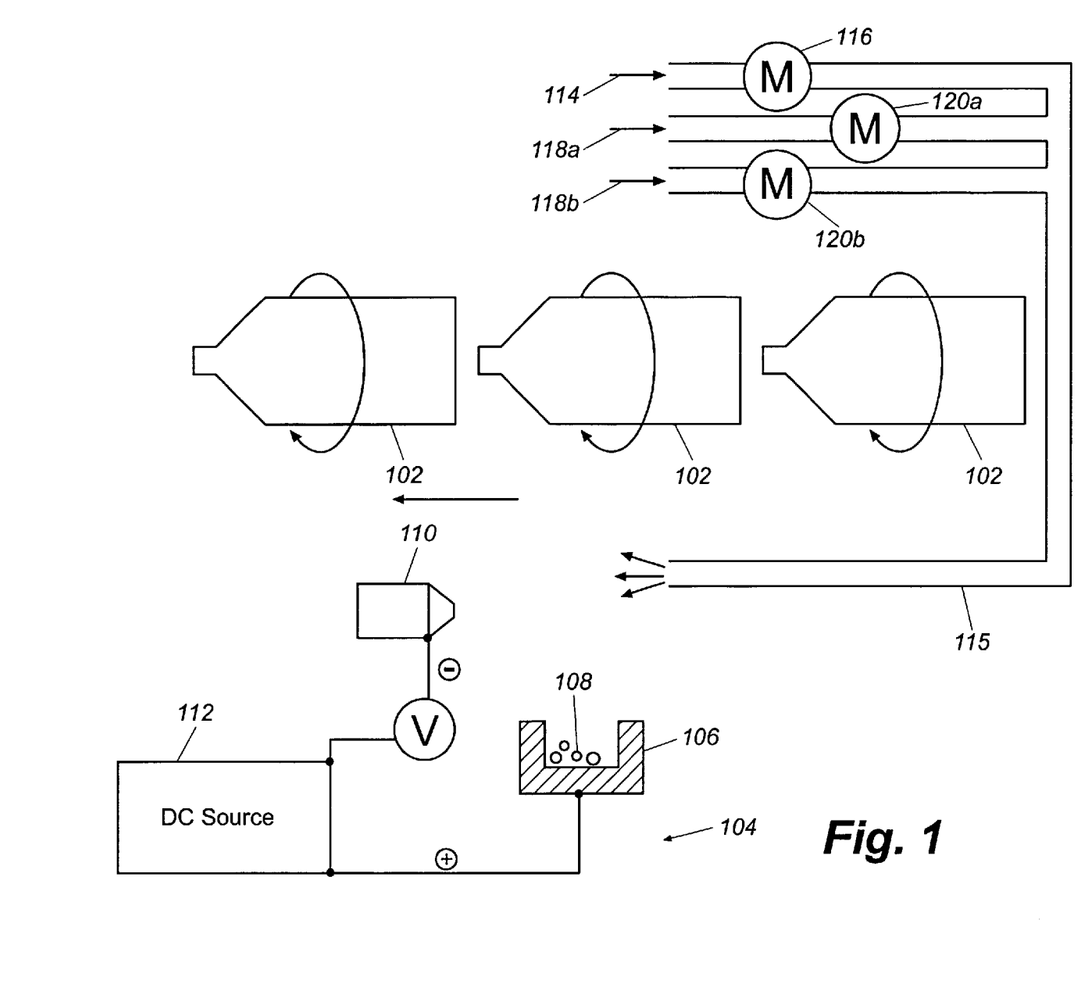
FIG. 1 is a process schematic diagram illustrating the addition of a carbon-containing process gas in an electric arc process to provide deposition of a carbon-containing inorganic coating (referred to as a "main coating").

In a preferred embodiment, the method builds upon the method described in PCT WO 98/40531. A preferred embodiment of this method is described with reference to FIG. 1. In FIG. 1, containers 102 rotate and move continuously past one, or a series of, coating source(s) 104 in a vacuum cell. The coating source 104 (also called an evaporator or evaporator system) includes a crucible 106, which contains an inorganic coating substance 108. The coating source 104 further includes a cathode 110 connected to the negative terminal of a direct electric current ("DC") source 112. The positive terminal of DC source 112 is connected to crucible 106. Crucible 106 is heated by an electric arc that is generated between cathode 110 and crucible 106. The energy of the electric arc melts inorganic coating substance 108, vaporizes it, and generates a plasma by energizing it. The melting and vaporization function of the electric arc also can be provided partly or wholly by radiant heaters or other form of heating known in the art. A carbon-containing gas 114 (or gas mixture) is metered via flow control device 116 through conduit 115 into the plasma above the crucible 106. Other process gases, shown as 118a and 118b also are metered via flow control devices 120a and 120b into the plasma generated above the crucible 106, through conduit 115 or alternatively through one or more other, separate conduits. The gases 114, 118a, and 118b, introduced into the plasma become plasma-energized, and a carbon-containing inorganic coating forms on the outer surface of the containers 102.

The process must be conducted under vacuum and within a vacuum cell, such as described in PCT WO 98/40531. The operating pressure of the process using carbon-containing gas is in region of $10^{-4}$ to $10^{-1}$ mbar, depending on the type of coating, but more usually in the region of $10^{-3}$ to $10^{-2}$ mbar. For equivalent coating rates, the operating pressure with a carbon-containing gas tends to be higher than the pressure normally used for non-carbon containing inorganic coatings. In other respects, the operating parameters are in the range of those described in PCT WO 98/40531 and in U.S. patent application Ser. No. 09/308,904, filed Sep. 10, 1999, which is expressly incorporated by reference herein.

The crucible 106 typically is supported by a cooled (e.g., water cooled) crucible holder (not shown). The crucible, also called a receptacle, is constructed of a material suitable for melting and evaporating the particular coating material chosen, and must be both inert and resistant to the temperature necessary for generating the quantities of vapor needed. For example, for evaporating silicon, carbon has been found to be a suitable material.

(1) Carbon-Containing Gas

The carbon-containing gas 114 preferably includes a low molecular-weight organic gas, such as acetylene, the light olefins (e.g., ethylene, butylene, propylene), or the light paraffins (e.g., ethane, butane, propane), or light aromatics (e.g., benzene, toluene), or light organics containing inorganic radicals (e.g., nitrites, sulphides, phosphates). In general, it is advantageous to use carbon-containing gases that have a high ratio of carbon to hydrogen atoms, such as the said light olefins. Acetylene is preferred. The quantity of carbon-containing gas metered to the plasma depends on type of inorganic coating substance selected, as well as the type of carbon-containing gas. For instance, acetylene will impart a brownish color to the coating if used to an excessive proportion with the inorganic coating substance. For example, a brownish tinge is expected when the vapor pressure of acetylene is about equal to the combined vapor pressure of the inorganic content of the vapors in the plasma.

(2) Inorganic Coating Substances and Process Gases

The coating substance 108 is an inorganic material that is solid at room temperature and has a high boiling-point, for example above 500° C. For example, the coating substance can be a metal, silicon or another non-metal, or a combination thereof.

Metal oxides of various multi-valent metals, for example aluminium oxide, can be applied in a carbon-containing coating, to provide a glass-like, clear transparency and good barrier that is resistant to handling abuse and environmental conditions. Quadra-valent metals, such as titanium, are particularly advantageous in combination with carbon.

The choice of coating substance and process depends on the process criteria (cost, coating color, transparency, bottle shape, degree of gas barrier necessary, size of bottle, and particularly the type of plastic used in the bottle). In the absence of carbon-containing gas, good gas barriers have been obtained by the procedures described herein by means of on-surface reaction of silicon with oxygen, giving $SiO_x$ where x is normally greater than 1.7, and normally insignificantly less than 2, and thus, glass-like transparent coatings. In the presence of carbon-containing gas, x is less, because some of silicon's valency sites are occupied by carbon, rather than oxygen, but the same principle applies, whereby the result is $SiO_yC_z$ and y+z is greater than 1.7, normally insignificantly less than 2.

It is also contemplated that the coating contains 0.01 to 50% of one or more of the glass-forming metal additives selected from the group consisting of Li, Na, K, Rb, Cr, Mg, Ca, Sr, Ba, Ti, Al, Mn, V, Cr, Fe, Co, Ni, Zn, Cu, Sn, Ge, and In. Small or trace additions of certain metals in silicon dioxide and other coatings can increase gas barrier. Such metals can be described as glass-forming metal additives because they are known as additives for use in making glass. Suitable glass-forming metal additives include Ag, Al, Ca, Cr, Cu, Fe, K, Mg, Mn, Na, Ni, Sn, Ti, and Zn. These metals are added to form a proportion of metal-in-coating of between 0.01 and 50%. For example, such additions to a coating composed primarily of $SiO_2$ increase the gas barrier by a factor of two or more. Such metals are added either to the crucible or are provided by the sacrificial erosion of the electron emitting plate or a shield of the cathode, this being constructed from the desired metal or mixture of metals.

Use of metals and other gaseous substances also enables colored coatings, or UV-absorbent coatings (by choosing the reactants appropriately). More than one layer, each layer comprising a different composition, can also be beneficial, particularly when producing colored coatings, since combining colored and transparent layers enables a good gas barrier to be obtained with minimum thickness of colored coating, thus enhancing recyclability. When more than one type of inorganic coating material is used, it is often necessary to provide more than one coating source, since differences in vapor pressure between substances can result in fractionation and uncontrolled proportions of each substance in the coating.

Furthermore, it is possible, using the systems and methods disclosed herein, to coat plastic container bodies with metals or other inorganic materials, such as silicon, which are not oxides, but rather, are elemental metals or other inorganic materials with a carbon-content. For example, plastic container bodies can be coated with carbon-containing elemental aluminum or silicon by eliminating the use of reactant gases from the vacuum cell, with the exception of the carbon-containing gas. The carbon-containing gas reacts to form elemental carbon; the inorganic material does not react.

In another embodiment, as an alternative to silicon dioxide coatings, carbon-containing clear/transparent metal oxide coatings can be produced with high barrier. Normally, silicon dioxide is the first choice in high-barrier applications requiring glass-like transparency, but metals are much easier than silicon to feed continuously into coating source. Moreover, the addition of a variety of metals to the choice of available inorganic coating materials widens the choice of suitable crucible materials. Therefore, the use of metals to produce carbon-containing metal oxide coatings has the potential to significantly reduce coating costs as compared silicon dioxide coatings.

An automatic source for supplying the inorganic material to the crucible can be provided, for example as a rod or other solid structure or in any other form. Preferably, the inorganic material is provided to the crucible in solid form and in particular will be in a chunky or nonpowder form. By minimizing the surface area of this material, detrimental effects of oxidization can be avoided.

The selection and use of one or more process gases, 118a and 118b for example, depends upon the particular inorganic coating substance and carbon-containing gas employed. For example, if the inorganic coating is an oxide, oxygen is a necessary process gas. In an alternative embodiment, the process gas includes an inert gas, such as argon, which can be used to enhance the plasma-energization process.

Operation of the Coating System

A potential is connected across the cathode 110 and the crucible 106, with the cathode being at the negative (cathodic) pole and crucible being at the positive (anodic) pole, so that energy in the form of a stream of electrons can flow between the cathode and the crucible. By varying the position of the cathode relative to the horizontal surface of the crucible, the proportion of energy available for plasma-making and evaporation can be adjusted. For example, in a first position, a large portion of the energy is available for plasma-making, while in a second position, almost all energy is used for evaporation and hardly any plasma is formed. The degree of energy to the coating source 104 is adjusted by the voltage to give the particular deposition rate on the external surface of container 102 which enables inorganic coating material 108, after evaporation, to deposit and react completely (i.e. stoichiometrically) with the process gases introduced into the coating chamber, thus ensuring that no significant amounts of unreacted gas can be occluded within the coating. For example, in one of the preferred embodiments, which uses silicon as the inorganic coating material with oxygen and a carbon-containing process gases, deposition rates onto the coating surface of 1 to 50 nm/s can give fully transparent coatings, with virtually $y+z=2$ in $SiO_yC_z$, while avoiding surplus oxygen (or air) and maintaining high vacuum in the coating cell (in region of $10^{-4}$ mbar to $10^{-2}$ mbar).

For producing good gas barrier results, it is beneficial to ensure that an on-surface reaction between the coating material and the process gas takes place after the coating material has been deposited and formed a solid lattice, since the process gas then densifies the coating by reacting into the solid lattice. Similarly, the carbon of the carbon-containing gas becomes integrated into the lattice, and provides greater flexing ability in the lattice.

The distance between a surface of a container body and the crucible is important when avoiding the coating material which reacts with the process gas before the coating material is deposited onto the container surface. Equally, the condition of the coating material is important in securing maximum on-surface reaction. A distance is chosen so as to give optimal use of the coating source, thus enabling it to coat as many containers as possible. This distance is dependent upon vacuum and deposition rate, but generally is between 0.50 m and 2 m. Increasing the distance enables high-energy plasmas to be created at the coating source without heat-damaging the container body.

The plasma generated in the vacuum cell can be a high-energy plasma, determined by position of cathode, voltage, the distance between the cathode and crucible, and the coating angle, which is desirably in the range from 0 to 70. The evaporators or coating sources can be arranged in rows so that the evaporator fluxes overlap their paths, giving an even longitudinal deposition rate R. This rate typically can be between about 1 and 50 nm/s. In a preferred embodiment, the plastic container is a bottle formed of PET having a thickness of about 0.35 mm and having a barrier coating thickness of about 50 nm.

Rotation and movement of the plastic containers over the coating source (and through a vacuum cell) preferably are conducted using the equipment and methods described in PCT WO 98/40531, in order to provide optimal coating of the containers. Appropriate means are provided for holding and/or transporting the container bodies through the coating process. The process can be a batch process, or more preferably is a continuous or semi-continuous process.

For certain plastic surfaces, surface pre-activation is useful for lightly activating a surface of the plastic container or bottle by forming free radicals on the surface. Such pre-activation is possible using a process gas, which is applied in plasma form before the coating process begins. Oxygen and inert gases are normally applied as pre-activation gases and the method of plasma-energizing of these is described hereunder in conjunction with FIG. 2, at the same vacuum cell pressure conditions as employed for coating. For some plastic substrates, it can be useful to de-gas the surface of the container in order to remove absorbed moisture and low molecular weight materials. This degassing can be achieved by holding the container in a vacuum for a period time between about 5 and 180 s. Bottles or containers blown immediately after blow molding can be degassed relatively quickly, and location of coating process beside a blow molder is desirable.

II. The Coated Plastic Container

The methods described herein preferably are used to form a coated plastic container comprising a plastic container body having an external surface and a coating on the external surface of the container. The coating provides a barrier that inhibits the flow of gas into and out of the container, which is particularly useful in producing carbonated beverages. For example, the gas barrier coating can protect the beverage from the flow of oxygen into the container from the outside or can inhibit the flow of carbon dioxide out of the beverage container. The resulting carbonated beverage has a longer shelf life because the coating on the container better holds the carbon dioxide within the container.

The carbon/inorganic coating is strongly adhered to the surface of the plastic container, such that even when the coating is non-continuous (e.g., due to scratches or fractures therein), the coating will continue to effectively adhere to the substrate such as an underlying plastic bottle. The coatings described herein therefore provide an effective gas barrier even if the surface is highly fractured. A high gas barrier of 1.25x, preferably 1.5x, and more preferably 2x, greater than the uncoated container can be obtained with the carbon-containing inorganic coating methods described herein, even when the coated container contains a pressurized fluid such as a carbonated beverage. The coated containers described herein furthermore can be made to have an equivalent gas barrier and reduced weight compared to a plastic container of similar surface area and volume and without said exterior inorganic coating. In a preferred embodiment for clear/transparent coatings, the barrier coating comprises a mixture of an inorganic oxide, carbon, and optionally a glass-forming metal additive, wherein the coated plastic container, when containing a pressurized fluid sealed in the interior space of the container body at a pressure of 60 psig (4.1 bars), possesses a gas barrier of at least 1.25x the gas barrier of the container without the coating, when the container without the coating contains a pressurized fluid sealed in the interior space at a pressure of 60 psig (4.1 bars).

The coated plastic containers preferably have a very thin carbon/inorganic coating. The coating preferably has a thickness from about 1 to about 100 nm.

The coated plastic container is made by depositing the coating on the exterior surface of the container body using vacuum vapor deposition, preferably plasma-enhanced vacuum vapor deposition. The resulting coating is preferably substantially homogeneous and amorphous and bonded either chemically, physically, or by a combination thereof, to the exterior surface of the container. As used herein, the term homogeneous means there is no substantial variation in atomic composition through the coating and the term amorphous means there is no substantial crystallinity in the coating as measured by standard x-ray diffraction techniques. In addition, the coating components are preferably present in the coating in concentrations that are substantially constant through the thickness of the coating. For example, with clear/transparent coatings, the inorganic oxide, carbon, and glass-forming metal additive should be present in the coating in concentrations that are substantially constant throughout the coating. The resulting coating is therefore very durable.

A variety of bottles types and coating combinations can be created. The methods and systems described herein also enable heat sensitive containers to be coated without significant temperature rise, and at all times maintaining a bottle temperature well below 60 C. In addition, the methods and systems enable mixtures and layers of substances to be applied which can be chosen for their color, UV-absorbing properties, or additional gas barrier properties. In example embodiments, silica or metal oxide coatings, are fully transparent and clear, and are applied to a clear bottle, without affecting the bottle's appearance.

The coating methods described herein enable the production of plastic containers having color or other features, along with the handling abuse-resistant high barrier. The carbon-containing coating can either be transparent and clear (whereby the deposit consists of carbon with either the oxide of a metal, or with the oxide of a non-metallic substance such as silicon), or be opaque or colored (whereby the deposit consists of carbon with either a metal, or with a non-metal such as silicon, or with a metal or non-metal compound of an inorganic gas such as nitrogen). Additional functionality can be incorporated into the inorganic coating by incorporating visible light absorbing species, rendering the plastic container cosmetically more appealing. For example, carbon-containing silicon coatings can have a shimmering-brown effect and provide good resistance to transmission of harmful UV radiation. As another example, carbon-containing metal coatings can have mirror-like metallic effects, which can be useful, for example, in promotional packaging.

III. Polymer Coating Methods and Systems

In another aspect of the present invention, methods are provided for applying a polymeric coating to a plastic container, preferably as a pre-treatment (undercoat) or post-treatment (overcoat), or more preferably as both pre- and post-treatment with a main inorganic coating in between. For example, the main coating can be either the carbon-containing coating described herein or the totally inorganic coatings described in PCT WO 98/40531. The methods involve a deposition process that includes introduction of a polymerizable organic gas in a plasma-enhanced system or alternatively vaporization of a polymer that can be vaporized without decomposition in the vacuum cell.

Polymerizable Organic Gas

Figure 2:
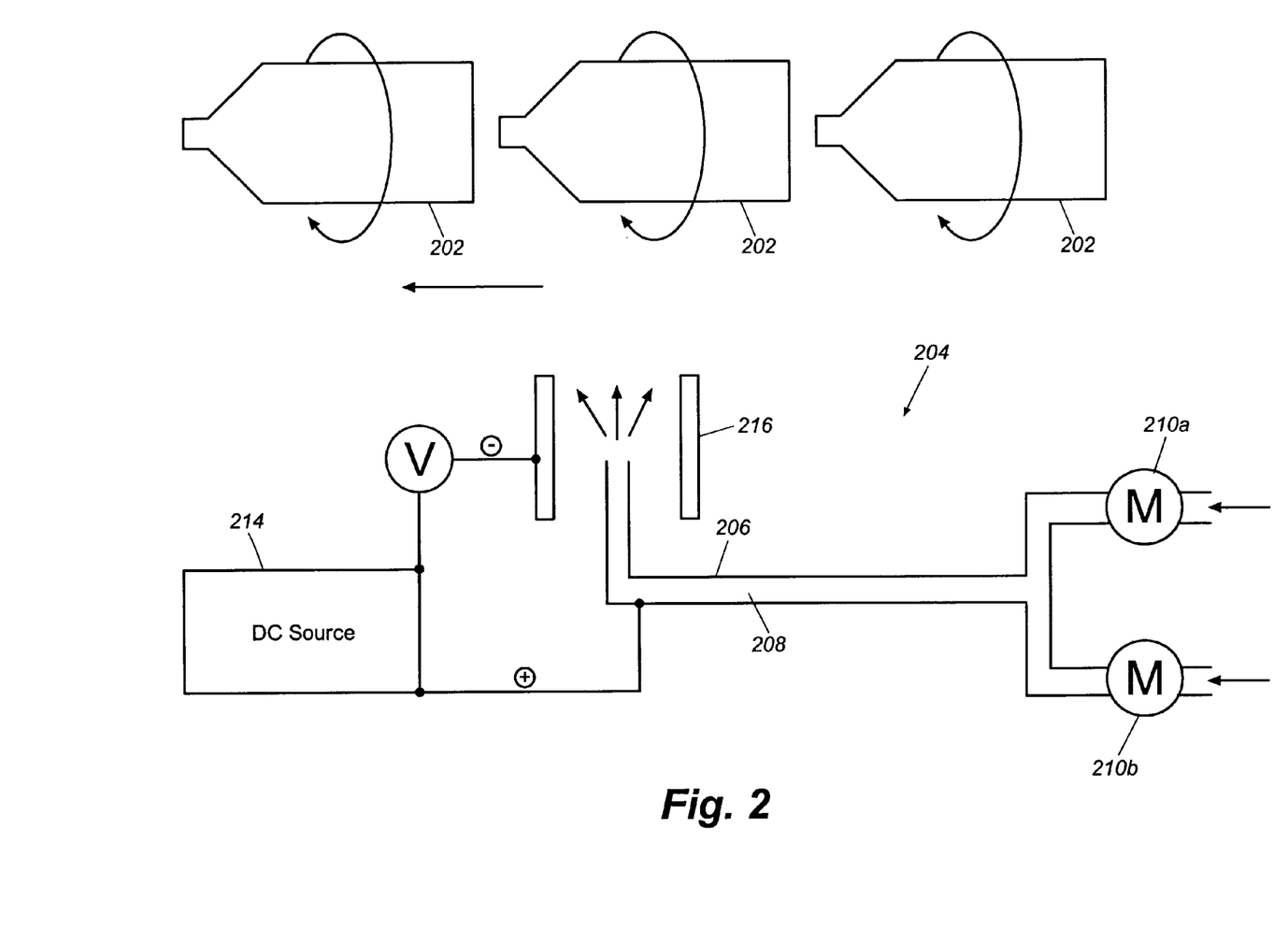
FIG. 2 is a process schematic diagram illustrating plasma energization of a gas stream for pre-treatment (i.e. deposition of an undercoat prior to application of the main coating) or post-treatment (i.e. deposition of a topcoat after deposition of the main coating) in an electric arc process.

A preferred embodiment of this method is described with reference to FIG. 2. In FIG. 2, containers 202 rotate and move continuously past one, or a series of, gas-energizing source(s) 204. The gas energizing source 204 includes a gas feed pipe 206, through which a gas 208 flows. The flow and mixture of gas 208 are controlled by flow control devices 210a and 210b (or further similar devices, not shown, depending on the number of components in the gas mixture). The gas energizing source 212 further includes a direct electric current ("DC") source 214. The negative terminal of DC source 214 is connected to a ring cathode 216. The positive terminal of the DC source 214 is connected to the gas feed pipe 206. An electric arc passes between the ring cathode 216 and the gas feed pipe 206, which assumes the anode function. The electric arc energizes the gas into a plasma consisting primarily of free radicals. These free radicals then deposit onto the surface of container 202, and polymerise, forming a very thin, polymer coating over the surface of the container. The said polymer coating has a thickness of about 1 to 100 nm, more usually in range 5 to 50 nm. The gas 208 includes a polymerizable organic gas, such as an olefin, paraffin, or light aromatic, such as benzene, toluene, or a silicon-containing gas, such as a silane. The gas 208 can be a mixture of two or more polymerizable organic gases. Ethylene is the preferred polymerizable organic gas with coatings of glass-like transparency, but a mixture of ethylene and acetylene can be at least as effective with coatings which are not transparent/clear, and are not affected by acetylene's brownish tinge. Acetylene is a preferred polymerizable organic gas in colored or opaque coatings, where its brownish tinge is acceptable. With certain polymerizable gases, for example paraffins, it is also advantageous to include an inert gas, such as argon, in the gas 208, in order to enhance the plasma.

Vaporized Polymer Gas

Figure 3:
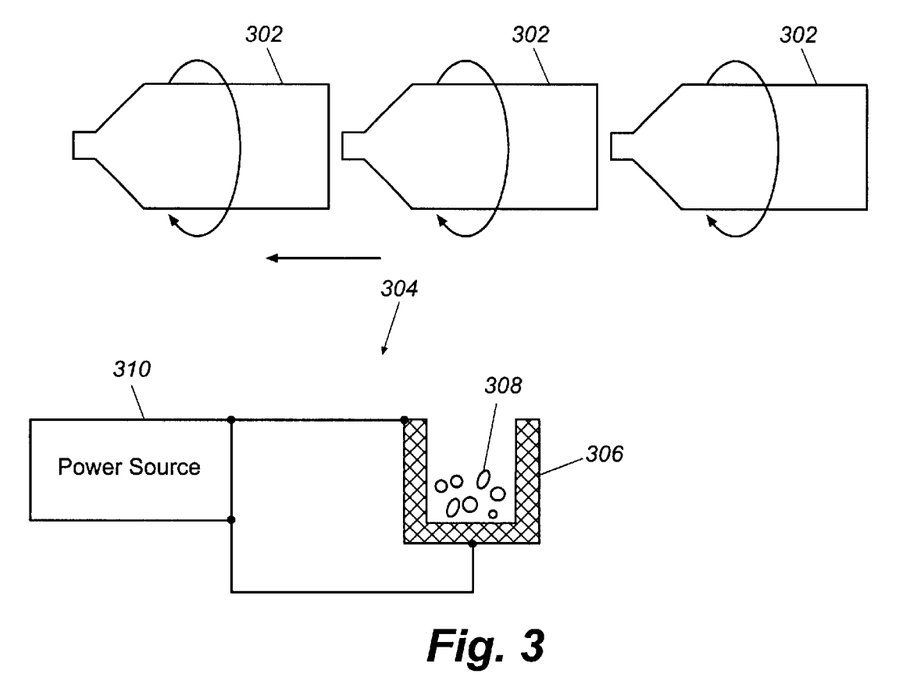
FIG. 3 is a process schematic diagram illustrating evaporation of a polymer and re-condensation of the polymer onto a container surface in order to provide an undercoat prior to deposition of a main coating, or a topcoat after deposition of a main coating.

A preferred embodiment of this method is described with reference to FIG. 3. In FIG. 3, containers 302 rotate and move continuously past one, or a series of, polymer-vaporizing source(s) 304. The polymer vaporizing source 304 includes a melter-evaporator 306 which contains granules of polymer 308, and is heated by an electric power source 310. For example, heating can be by radiant heaters, resistance heaters, or other means known in the art. The vaporized polymer then deposits onto the surface of container 302, forming a very thin, polymer-coating over the surface of the container.

Polymer 308 is a polymer that evaporates under the vacuum conditions of the coating process without decomposing. Examples of suitable polymers include low molecular-weight olefins, polyesters, and polypropylenes. Polyethylene is a preferred polymer. Coating thickness is in range 10 to 1000 nm, more usually under 200 nm.

Pre-treatment and/or Post-treatment

Both the vaporized polymer gas method and the polymerizable organic gas method, can be used as a pre-treatment to a main coating (i.e. as undercoat between the bottle surface and the main coating), or as post-treatment to a main coating (i.e. as topcoat over the main coating), or as both a pre-treatment and a post-treatment to main coating. The choice between the polymerizable gas method and the polymer gas method primarily depends on the substrate and the type of main coating for which the methods can serve as a pre- or post-coat. In extreme handling conditions, where a thick topcoat is likely to be advantageous, the polymer vaporization method generally is preferable for applying a topcoat. However, the 2 methods can be applied in combination with one another, so that an undercoat produced by the polymerizable gas method can be used in combination with a topcoat produced by the polymer gas method. These pre-treatment and post-treatment processes can be applied advantageously either with carbon-containing coatings described herein, or with fully inorganic coatings, as described in PCT WO 98/40531.

When used as a pre-treatment, the thin polymer coating, which is sandwiched between the container surface and the main coating, provides the following advantages: (i) it activates the surface of the container by providing free radicals, thus enabling better adhesion of a main coating; (ii) it provides better cover of substrate surface imperfections, as the polymer-forming gas flows into these imperfections better than the inorganic particles of the main coating, thereby reducing the incidence of pin-holes in the coating and improving the barrier; and (iii) it improves tolerance of main coating to abrasion and handling abuse, by providing a soft layer between the surface of the container and the main coating, thereby reducing the tendency of the main coating to crack during handling and thus reducing loss in barrier during handling abuse.

When used as a post-treatment, the thin polymer coating provides the following advantages: (i) it fills pin-holes in the main coating, and thus improves the barrier; (ii) it enhances coating flexibility, by enabling the main coating to flex and expand without cracking, thereby reducing loss in barrier due to container expansion under severe conditions; and (iii) it protects the main coating from handling abuse, thus reducing loss in barrier due to bottling plant, distribution, or market conditions; and (iv) it reduces coating brittleness by providing topcoat cushioning, thus improving tolerance to handling abuse and/or container expansion.

The polymerizable organic gas method can be applied either as pre-treatment or as post-treatment in combination with the method for applying a main coating, as described with reference to FIG. 1 for applying the main coating. With certain coating applications and coating types, the increase in barrier and resistance to handling and stretching, which the pre-treatment and post-treatment methods provide, can eliminate the need for a carbon-content in the main coating. However, in applications with high demands on barrier and resistance to handling, the preferred method is to apply a carbon-containing main coating, with at least a pre-treatment or a post-treatment, or preferably both. The three methods (i.e. pre-treatment, the carbon-containing main coating, and the post-treatment) are normally to be regarded as steps of one process, and best results are obtained when all are applied.

IV. Integrated System for Coating Plastic Container Bodies

In one embodiment, the system for making the coated plastic container comprises a vacuum cell, a container feeder, a conveyor and at least one evaporator (i.e. coating source) disposed in the vacuum cell for supplying a coating vapor. The vacuum cell is capable of maintaining a vacuum within the vacuum cell and the container feeder supplies plastic container bodies into and withdraws coated plastic containers out from the vacuum cell. The plastic container bodies each have an external surface and an interior surface defining an interior space. The conveyor conveys the plastic container bodies through the vacuum cell and the at least one source of coating vapor supplies coating vapor to the external surface of the container bodies as the container bodies are conveyed through the vacuum cell. The at least one source of coating vapor and the conveyor are structured and arranged within the vacuum cell such that the coating vapor from the at least one source deposits a thin coating on the external surface of the containers, the thin coating comprises an carbon-containing inorganic oxide and a glass forming metal additive and bonds to the external surface of the container bodies and the resulting coated plastic containers, when containing a pressurized fluid sealed in the interior space at a pressure of 60 psig (4.1 bars), possess a gas barrier of at least 1.25x the gas barrier of the containers without the coating, when the containers without the coating contain a pressurized fluid sealed in the interior space at a pressure of 60 psig (4.1 bars). The coating vapor produced in the vacuum cell is desirably in the form of a plasma. A suitable device for producing the plasma is a cold cathode, also known as an electron gun.

Figure 4:
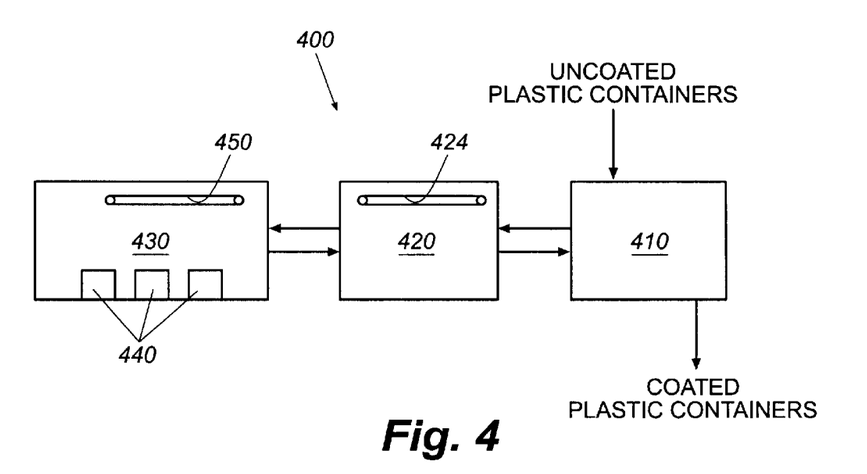
FIG. 4 is a process flow diagram illustrating a high speed high volume barrier coating system with an optional polymer coating subsystem.

A preferred embodiment of the coating system described herein is illustrated in FIG. 4. A high speed, high volume coating system 400 is shown for coating plastic container bodies with a carbon-containing inorganic oxide barrier coating. This high speed, high volume system 400 is useful, however, to apply the same coatings with the same materials to the same type of plastic containers as with the system previously described with reference to FIG. 1. This high speed, high volume system 400 operates under substantially the same parameters as the system described in PCT WO 98/40531, with the coating system modified as described herein. Generally described, the high speed, high volume coating system 400 comprises a continuous and automatic container feeder 410 for delivering plastic container bodies, such as PET bottles, to a vacuum cell 430 which houses a continuous and automatic conveyor 450 and an evaporator system 440, which serves as the source of coating vapor. An optional polymer coating sub-system 420 is shown incorporated into the coating system, when the carbon-containing inorganic oxide barrier coating serves as a pre-treatment, post-treatment, or both pre-treatment and post-treatment coating for a polymer coating.

Container Feeder

The container feeder 410 can be a rotary system which continuously and automatically supplies uncoated plastic container bodies from a source of plastic container bodies to the continuous and automatic conveyor 424 of standard coating sub-system 420, or if the polymer coating sub-system 420 is omitted, then to the conveyor 250 inside the vacuum cell 430 while the vacuum cell maintains a vacuum inside the vacuum cell housing. The container feeder 410 supplies the plastic container bodies (not shown) to the vacuum cell 430 at a high speed and a high volume, for example at a rate between 20,000 and 60,000 containers per hour. The container feeder 210 also automatically and continuously retrieves coated plastic container bodies from the conveyor 424 of polymer coating sub-system 420 or from the conveyor 450 inside the vacuum cell 430 and transports the coated plastic container bodies to a location outside of the coating system 400 such as a beverage packaging line. Vacuum pumps and ports can be used to facilitate maintenance of the vacuum in the vacuum cell 430 at its interface with the container feeder 410, and optionally at the interface between the container feeder 410 and the polymer coating sub-system 420 when included.

The uncoated plastic container bodies are capped and sealed with caps by a capper or capping device and then partially evacuated before being transported into the vacuum cell 430 or polymer coating sub-system 420. The caps function to seal the threaded finish of the container body from the coating vapors, to provide a method for attaching the container bodies to the conveyor 450 or 424, and to control the pressure inside the container body. The caps fit tightly over the threaded opening or fitment of the plastic container bodies and may contain a ferrous metal element so that the plastic container bodies can be magnetically carried by the conveyor 424 or 450. Desirably, the plastic container bodies contain enough air while traveling through the vacuum cell 430 so that the container bodies are pressurized compared to the surrounding environment inside the vacuum cell. Suitable container feeders are described, for example, in PCT WO 98/40531.

Vacuum Cell

The barrier coating process occurs in the vacuum cell 430. The vacuum cell 430 includes a vacuum cell housing in which a very high vacuum is maintained, and the evaporator system 440. Desirably, the coating process is run inside the vacuum cell housing at a pressure within the range from about $1\times10^{-4}$ mbar to about $50\times10^{-4}$ mbar, and more preferably from about $2\times10^{-4}$ mbar to about $10\times10^{-4}$ mbar. One or more diffusion or vacuum pumps are used to maintain the desired vacuum in the vacuum cell 430. The vacuum cell preferably is provided with a condenser and a cryogenic cooler to condense and freeze any water inside the vacuum cell 430 to reduce the amount of water that has to be removed by the vacuum pumps. Suitable vacuum cells are described, for example, in PCT WO 98/40531.

Conveyor

The conveyor 450 moves the container bodies through the coating process that occurs in the vacuum cell. In one embodiment, the conveyor includes a generally A-shaped frame slidably mounted along rails extending longitudinally through the vacuum cell, and a plurality of magnetic container holders. The conveyor frame is mounted above the coating vapor source, i.e. evaporator system 440, so that the conveyor 450 carries the plastic container bodies above the coating vapor source.

Inn one embodiment, the conveyor frame forms an endless double loop to carry the container bodies over the coating vapor source four times, twice with the sides of the container bodies facing the coating vapor source and twice with the bottoms of the container bodies facing the coating vapor source. The sides of the container bodies face the coating vapor source when traveling along an outer, lower loop and the bottoms of the container bodies face the coating vapor source when the container bodies are transported along an inner, upper loop. Along the outer loop, the rail is angled upwardly and inwardly to orient the container bodies to slightly upwardly and inwardly so that the sides of the container bodies face the coating vapor source. Along the inner loop, the rail is oriented vertically so that the container bodies are oriented substantially vertically with the bottoms of the container bodies facing the coating vapor source. The container holder can include a magnet which draws and holds the caps placed on the threaded ends or fitments of the plastic container bodies. This magnetic force holds the container bodies to the container holders throughout the coating process. The container holder rotates the container bodies constantly while conveying the container bodies through the container housing. Suitable conveyors are described, for example, in PCT WO 98/40531.

Evaporator System

The evaporator system 440 provides the coating vapor for the main coating. For example, it may comprise three or four evaporators in series along the length of the coating housing beneath the conveyor 450 in the vacuum cell 430. Suitable evaporators or (coating sources) are described above and, for example, in PCT WO 98/40531 and in U.S. patent application Ser. No. 09/128,456, filed Aug. 3, 1998, the disclosure of which is expressly incorporated herein in its entirety. Each evaporator includes a receptacle (i.e. a crucible) containing a vaporizable material and electrically connected as an anode. Each evaporator also includes a cold cathode, which preferably comprises brass or magnesium, but which also can be made of other components, preferably metals which are useful as the glass-forming metal additives that vaporize and form part of the inorganic oxide coating on the container bodies, as described herein. Each evaporator further includes gas feeds for delivering process gases and a carbon-containing gas.

The receptacle is separately heated by appropriate means, such as inductive or resistance heating. Each evaporator includes a housing containing the anode, the vaporizable solid receptacle, and a heater, such as a carbon felt resistance heater, for heating the receptacle to high temperatures, for example between 1200 and 1800° C. Silicon, for example, is heated in a receptacle to a temperature of about 1500 C. An e-gun or cold cathode is positioned to further heat the vaporizable material in the receptacle and create a plasma vapor, which is emitted through an opening in the housing. The coating angle of the plasma vapor emitted by the evaporators preferably is 30 to 60, and the distance between the evaporators and the container bodies preferably is 0.5 to 2 m. A dust shield preferably is include above the evaporators to protect the evaporators from coating particles that do not adhere to the container bodies.

Polymer Coating Subsystem

The polymer coating sub-system 420 can be incorporated into the coating system 400. It is used as pre-treatment, post-treatment, or both pre-treatment and post-treatment coating for the carbon-containing inorganic oxide barrier. The polymer coating sub-system can essentially be any known process for coating plastic containers, but preferably is one of the polymer coating process described herein.

The polymer coating sub-system 420 is shown integrated into the coating system 400 between the container feeder 410 and the vacuum cell 430. In an alternative embodiment, however, the polymer coating sub-system 420 can be upstream of the coating system 400, to coat the uncoated plastic containers with a polymer layer before they are fed to transported to the container feeder 410 (i.e. the post-treatment use), or the polymer coating sub-system 420 can be downstream of the coating system 400, to apply a polymer layer over the carbon-containing inorganic oxide barrier coating layer on to the plastic containers (i.e. the pre-treatment use).

In one embodiment, the polymer coating sub-system 420 and the evaporator system 440 are combined within a single vacuum cell and utilize a common conveyor through both the polymer coating and inorganic coating processes.

Operation of High Speed, High Volume Coating System

Generally described, the plastic container bodies are coated with an inorganic oxide coating such as silica by feeding the container bodies automatically and continuously to the vacuum cell 430 with the container feeder 410, conveying the container bodies through the vacuum cell with the conveyor 450 over the evaporator system and withdrawing the coated container bodies from the vacuum cell with the container feeder. First, the evaporator receptacles are loaded with a vaporizable inorganic material, such as silicon, and the air in the vacuum cell 430 is evacuated to a pressure of about $2\times10^{-4}$ mbar, and process gases, e.g., oxygen, are fed into the vacuum cell 430 through appropriate gas inlets.

Uncoated plastic container bodies are supplied to the container feeder 410 from a source, such as a plastic container blow molding line. The uncoated container bodies are transports to the conveyor 450 and capped with magnetic venting caps, which allow the container bodies to remain slightly pressurized in the high vacuum environment of the vacuum cell 430. The container holders of the conveyor 450 magnetically attach to the container body caps and carry the container bodies back and forth four times through the coating housing over the evaporators in the vacuum cell 430. The silicon (and/or other organic materials) in the evaporator receptacles is heated by the resistance heaters and the evaporators and the associated cold cathodes, to create a plasma vapor comprising evaporated silicon and small amounts of evaporated metal additives such as zinc, copper, or magnesium, which are evaporated from the cold cathodes themselves. As the container bodies pass over the evaporator system 440, the material in the plasma vapor deposits on the exterior surface of the container bodies and reacts with the oxygen in the coating housing to form a thin, durable inorganic oxide coating on the exterior surface of the container bodies. The caps on the threaded openings or fitments of the container bodies leave the threaded openings or fitments uncoated. After four passes through the vacuum cell at the appropriate orientations, the coated container bodies are taken by the container feeder 410 transported to another conveyor towards, for example, a beverage packaging line, wherein the coated containers are at least partially filled with a beverage and then sealed such as with a screw-on plastic closure.

V. Recycling

The coated plastic containers described herein are particularly suitable for recycling, for example chemical or physical recycling methods. Advantageously, the coating materials are inert and remain solid when the plastic bottle is melted for recycling. The coating is acceptable for food contact and therefore will not adversely affect the recycling efforts when ground or depolymerized in the recycling processes. Because relatively small particles are used in the coating, a haze in the finally produced recycled product can be avoided. Further, the coatings are all removable when washed with hot caustic, which is a common method of recycling plastics. While the coated containers can be used in recycling many types of plastic, it is contemplated that the coated containers can be used with plastic articles, such as containers or bottles and more particularly, with plastic beverage bottles. Separation of coated and uncoated plastics advantageously is not required with the coated containers described herein. Bottle-to-bottle recycling is possible.

Those skilled in the art will recognize, or be able to ascertain using no more than routine experimentation, many equivalents to the specific embodiments of the invention described herein. The references cited herein are hereby incorporated by reference.

We claim:

1. A method for making a coated plastic container possessing a gas barrier, the method comprising:

positioning a plastic container within a vacuum cell, the vacuum cell maintaining a vacuum in the vacuum cell, the plastic container having an external surface;

feeding one or more process gases into the vacuum cell, at least one of the process gases being a carbon-containing gas;

heating and evaporating an inorganic coating material with an evaporator disposed in the vacuum cell to form a coating vapor;

energizing the coating vapor to form a plasma; and removing the coated plastic container from the vacuum cell;

wherein the plasma reacts with at least one of the process gases and deposits a thin coating on the external surface of the plastic container, the thin coating comprising carbon from the carbon-containing gas and inorganic material from the inorganic coating material.

2. The method of claim 1, further comprising feeding a plurality of the plastic containers into the vacuum cell, and conveying each plastic container through one or more positions within the vacuum cell.

3. A method of packaging a beverage comprising the steps of:

providing a coated plastic container made in accordance with the method of claim 1, the coated plastic container comprising a plastic container body having an interior surface defining an interior space and an external surface and a coating on the external surface comprising an inorganic material and carbon, the coating providing a gas barrier;

filling at least a portion of the interior space of the coated plastic container with a beverage; and sealing the coated plastic container after the step of filling.

4. The method of claim 1, wherein the carbon-containing gas comprises a low-molecular weight organic gas.

5. The method of claim 1, wherein the carbon-containing gas comprises a light olefin, a light paraffin, a light aromatic, a light organic containing inorganic radicals, or a mixture thereof.

6. The method of claim 1, wherein the carbon-containing gas is selected from the group consisting of ethylene, butylenes, propylene, ethane, butane, propane, benzene, toluene, and combinations thereof.

7. The method of claim 1, wherein the carbon-containing gas comprises acetylene.

8. The method of claim 1, wherein at least one of said one or more process gases is selected from the group consisting of oxygen, nitrogen, sulfur, and halogens.

9. The method of claim 1, wherein the inorganic coating material is selected from the group consisting of silicon, metals, and combinations thereof.

10. The method of claim 1, wherein said one or more process gases comprises oxygen and the inorganic material in the thin coating comprises an inorganic oxide.

11. The method of claim 10, wherein the inorganic coating material comprises a metal and the inorganic oxide is a metal oxide.

12. The method of claim 11, wherein the metal oxide is aluminum oxide.

13. The method of claim 11, wherein the metal oxide is an oxide of a quadra-valent metal.

14. The method of claim 13, wherein the quadra-valent metal is titanium.

15. The method of claim 10, wherein the inorganic oxide comprises an oxide of silicon.

16. The method of claim 1, wherein at least one of said one or more process gases is selected from the group consisting of argon, xenon, neon, krypton, and helium.

17. A method for making a coated plastic container possessing a gas barrier, the method comprising:

positioning a plastic container within a vacuum cell, the vacuum cell maintaining a vacuum in the vacuum cell, the plastic container having an external surface;

feeding one or more process gases into the vacuum cell;

heating and evaporating an inorganic coating material with an evaporator disposed in the vacuum cell to form a coating vapor;

energizing the coating vapor to form a first plasma;

feeding a polymerizable gas into the vacuum cell;

energizing the polymerizable gas to form a second plasma comprising polymerizable free radicals, wherein the polymerizable gas comprises an olefin, a paraffin, a light aromatic, or a combination thereof; and removing the coated plastic container from the vacuum cell;

wherein the first plasma reacts with at least one of the process gases and deposits a thin main coating onto the plastic container, the thin main coating comprising inorganic material from the inorganic coating material, and the polymerizable free radicals from the second plasma deposit and polymerize to form a thin polymer coating, directly or indirectly, onto the plastic container or on the main coating, the thin polymer coating being distinct from the thin main coating.

18. The method of claim 17, wherein the thin polymer coating is formed onto the external surface of the plastic container, and then the thin main coating is formed onto the thin polymer coating.

19. The method of claim 18, wherein a second thin polymer coating is formed onto the thin main coating, such that the thin main coating is sandwiched between the thin polymer coating and the second thin polymer coating.

20. The method of claim 17, wherein the thin main coating is formed onto the external surface of the plastic container, and then the thin polymer coating is formed onto the thin main coating.

21. A method of packaging a beverage comprising the steps of:

providing a coated plastic container made in accordance with the method of claim 17, the coated plastic container comprising a plastic container body having an interior surface defining an interior space and an external surface and a coating on the external surface comprising an inorganic material and carbon, the coating providing a gas barrier;

filling at least a portion of the interior space of the coated plastic container with a beverage; and sealing the coated plastic container after the step of filling.

22. The method of claim 17, wherein the polymerizable gas is selected from the group consisting of acetylene, ethylene, and combinations thereof.

23. A method for making a coated plastic container possessing a gas barrier, the method comprising:

positioning a plastic container within a vacuum cell, the vacuum cell maintaining a vacuum in the vacuum cell, the plastic container having an external surface;

feeding one or more process gases into the vacuum cell, wherein at least one of the process gases is a carbon-containing gas;

heating and evaporating an inorganic coating material with an evaporator disposed in the vacuum cell to form a coating vapor;

energizing the coating vapor to form a first plasma;

feeding a polymerizable gas into the vacuum cell;

energizing the polymerizable gas to form a second plasma comprising polymerizable free radicals; and removing the coated plastic container from the vacuum cell;

wherein the first plasma reacts with at least one of the process gases and deposits a thin main coating onto the plastic container, the thin main coating comprising inorganic material from the inorganic coating material and carbon from the carbon-containing gas, and the polymerizable free radicals from the second plasma deposit and polymerize to form a thin polymer coating, directly or indirectly, onto the plastic container or on the main coating, the thin polymer coating being distinct from the thin main coating.

24. The method of claim 23, wherein the carbon-containing gas comprises a light olefin, a light paraffin, a light aromatic, a light organic containing inorganic radicals, or a mixture thereof.

25. The method of claim 23, wherein the carbon-containing gas is selected from the group consisting of ethylene, butylene, propylene, ethane, butane, propane, benzene, toluene, and combinations thereof.

26. The method of claim 23, wherein the carbon-containing gas comprises acetylene.

27. The method of claim 23, wherein the polymerizable gas comprises an olefin, a paraffin, or a light aromatic compound.

28. A method for making a coated plastic container possessing a gas barrier, the method comprising:

positioning a plastic container within a vacuum cell, the vacuum cell maintaining a vacuum in the vacuum cell, the plastic container having an external surface;

feeding one or more process gases into the vacuum cell;

heating and evaporating an inorganic coating material with an evaporator disposed in the vacuum cell to form a first coating vapor;

energizing the first coating vapor to form a plasma;

heating and evaporating a polymer to form a second coating vapor, the polymer being evaporable under vacuum conditions without decomposition; and removing the coated plastic container from the vacuum cell;

wherein the plasma reacts with at least one of the process gases and deposits a thin main coating onto the plastic container, the thin coating comprising inorganic material from the inorganic coating material, and the second coating vapor recondenses and forms a thin polymer coating, directly or indirectly, onto the plastic container.

29. The method of claim 28, wherein the thin polymer coating is formed onto the external surface of the plastic container, and then the thin main coating is formed onto the thin polymer coating.

30. The method of claim 29, wherein a second thin polymer coating is formed onto the thin main coating, such that the thin main coating is sandwiched between the thin polymer coating and the second thin polymer coating.

31. The method of claim 28, wherein the thin main coating is formed onto the external surface of the plastic container, and then the thin polymer coating is formed onto the thin main coating.

32. A method of packaging a beverage comprising the steps of:

providing a coated plastic container made in accordance with the method of claim 28, the coated plastic container comprising a plastic container body having an interior surface defining an interior space and an external surface and a coating on the external surface comprising an inorganic material and carbon, the coating providing a gas barrier;

filling at least a portion of the interior space of the coated plastic container with a comprising inorganic material and carbon, the coating providing a gas barrier; beverage; and sealing the coated plastic container after the step of filling.

33. The method of claim 28, wherein the vaporizable polymer comprises a polyolefin, a polyester, a polycarbonate, or a mixture thereof.

34. The method of claim 28, wherein the vaporizable polymer comprises polyethylene.

35. A method for making a coated plastic container possessing a gas barrier, the method comprising:

positioning a plastic container within a vacuum cell, the vacuum cell maintaining a vacuum in the vacuum cell, the plastic container having an external surface;

feeding one or more process gases into the vacuum cell, wherein at least one of the process gases is a carbon-containing gas;

heating and evaporating an inorganic coating material with an evaporator disposed in the vacuum cell to form a first coating vapor;

energizing the first coating vapor to form a plasma;

heating and evaporating a polymer to form a second coating vapor, the polymer being evaporable under vacuum conditions without decomposition; and removing the coated plastic container from the vacuum cell;

wherein the plasma reacts with at least one of the process gases and deposits a thin main coating onto the plastic container, the thin coating comprising inorganic material from the inorganic coating material and carbon from the carbon-containing gas, and the second coating vapor recondenses and forms a thin polymer coating, directly or indirectly, onto the plastic container.

36. The method of claim 35, wherein the vaporizable polymer comprises a polyolefin, a polyester, a polycarbonate, or a mixture thereof.

37. The method of claim 35, wherein the vaporizable polymer comprises polyethylene.

38. A method for making a coated plastic container possessing a gas barrier, the method comprising:

positioning a plastic container within a vacuum cell, the vacuum cell maintaining a vacuum in the vacuum cell, the plastic container having an external surface;

heating and evaporating an inorganic coating material with an evaporator disposed in the vacuum cell to form a coating vapor;

energizing the coating vapor to form a plasma;

feeding a carbon-containing gas into the vacuum cell; and removing the coated plastic container from the vacuum cell;

wherein the plasma deposits a thin inorganic coating on the external surface of the plastic container, the thin coating comprising carbon and the inorganic coating material.

39. The method of claim 38, wherein the inorganic material comprises a metal, silicon, or a mixture thereof, and the thin coating further comprising the metal, silicon, or a mixture thereof, respectively.

40. The method of claim 38, further comprising forming a thin polymer coating onto the plastic container, the thin polymer coating being distinct from the thin inorganic coating and positioned (i) on top of the thin inorganic coating, (ii) between the thin inorganic coating and the external surface of the container, or (iii) in both positions (i) and (ii).

41. The method of claim 38, wherein the carbon-containing gas comprises a light olefin, a light paraffin, a light aromatic, a light organic containing inorganic radicals, or a mixture thereof.

42. The method of claim 38, wherein the carbon-containing gas is selected from the group consisting of ethylene, butylene, propylene, ethane, butane, propane, benzene, toluene, and combinations thereof.

43. The method of claim 38, wherein the carbon-containing gas comprises acetylene.

* * * * *